United States Patent [19]

Suzuki et al.

[11] E Patent Number: Re. 33,462

[45] Reissued Date of Patent: Nov. 27, 1990

[54] METHOD AND APPARATUS FOR TRANSMITTING DIGITAL DATA

[75] Inventors: Tadao Suzuki; Yoichiro Sako, both of Tokyo; Shunsuke Furukawa; Tsuneo Furuya, both of Kanagawa, all of Japan; Constant P. M. J. Baggen, Eindhoven, Netherlands

[73] Assignee: Sony Corporation, Tokyo, Japan

[21] Appl. No.: 379,627

[22] Filed: Jul. 13, 1989

Related U.S. Patent Documents

Reissue of:

[64] Patent No.: 4,680,764
Issued: Jul. 14, 1987
Appl. No.: 714,892
Filed: Mar. 22, 1985

[30] Foreign Application Priority Data

Mar. 24, 1984 [JP] Japan ..... 59-57595
Mar. 24, 1984 [JP] Japan ..... 59-57596

[51] Int. Cl.[5] ..... G06F 11/10

[52] U.S. Cl. ..... 371/37.5; 371/39.1; 371/40.1

[58] Field of Search ..... 371/37.5, 37.4, 40.1, 371/38.1, 39.1

[56] References Cited

U.S. PATENT DOCUMENTS

| | | | |
|---|---|---|---|
| 4,413,340 | 11/1983 | Odaka et al. | 371/38.1 |
| 4,437,185 | 3/1984 | Sako et al. | 371/39 |
| 4,541,093 | 9/1985 | Furuya et al. | 371/37.4 |
| 4,559,625 | 12/1985 | Berlekamp et al. | 371/2.1 |
| 4,562,577 | 12/1985 | Glover et al. | 371/40.1 |
| 4,564,945 | 1/1986 | Glover et al. | 371/40.1 |

*Primary Examiner*—Charles E. Atkinson
*Attorney, Agent, or Firm*—Lewis H. Eslinger; Jay H. Maioli

[57] ABSTRACT

Information is transmitted by a digital audio transmission line, which may include recording and play back from a digital audio disc, that includes information other than conventional two channel audio signals and error correction of the data transmitted in either direction between a user and a medium is provided. Information integrity is maintained by a first and second cross-interleave Reed-Solomon code (CIRC), in which a third Reed-Solomon code is overlaid on the CIRC code, whereby a sector is built from users words and protected by a quasi-product code, and then an encoded sector is divided into groups, which are group-wise presented to the CIRC encoder.

23 Claims, 8 Drawing Sheets

Fig. 7

| N \ M | 0 | 1 | 2 | 3 | 4 | . | . | . | 40 | 41 | 42 | Q0 | Q1 |
|---|---|---|---|---|---|---|---|---|---|---|---|---|---|
| 0 | 0000 | 0044 | 0088 | 0132 | 0176 | .... | .... | .... | 0642 | 0686 | 0730 | 1118 | 1144 |
| 1 | 0043 | 0087 | 0131 | 0175 | 0219 | .... | .... | .... | 0685 | 0729 | 0773 | 1119 | 1145 |
| 2 | 0086 | 0130 | 0174 | 0218 | 0262 | .... | .... | .... | 0728 | 0772 | 0816 | 1120 | 1146 |
| 3 | 0129 | 0173 | 0217 | 0261 | 0305 | .... | .... | .... | 0771 | 0815 | 0859 | 1121 | 1147 |
| 4 | 0172 | 0216 | 0260 | 0304 | 0348 | .... | .... | .... | 0814 | 0858 | 0902 | 1122 | 1148 |
| . | .... | .... | .... | .... | .... | | | | .... | .... | .... | .... | .... |
| . | .... | .... | .... | .... | .... | | | | .... | .... | .... | .... | .... |
| . | .... | .... | .... | .... | .... | | | | .... | .... | .... | .... | .... |
| . | .... | .... | .... | .... | .... | | | | .... | .... | .... | .... | .... |
| . | .... | .... | .... | .... | .... | | | | .... | .... | .... | .... | .... |
| . | .... | .... | .... | .... | .... | | | | .... | .... | .... | .... | .... |
| . | .... | .... | .... | .... | .... | | | | .... | .... | .... | .... | .... |
| 22 | 0946 | 0990 | 1034 | 1078 | 0004 | .... | .... | .... | 0470 | 0514 | 0558 | 1140 | 1166 |
| 23 | 0989 | 1033 | 1077 | 0003 | 0047 | .... | .... | .... | 0513 | 0557 | 0601 | 1141 | 1167 |
| 24 | 1032 | 1076 | 0002 | 0046 | 0090 | .... | .... | .... | 0556 | 0600 | 0644 | 1142 | 1168 |
| 25 | 1075 | 0001 | 0045 | 0089 | 0133 | .... | .... | .... | 0599 | 0643 | 0687 | 1143 | 1169 |

METHOD AND APPARATUS FOR TRANSMITTING DIGITAL DATA

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates generally to a method of transmitting digital data using a compact digital disc and, more particularly, to a method of recording information other than two channel audio signals on such disc and reproducing same with enhanced error correction capability.

2. Description of the Background

The system known as compact audio disc systems are now well known and such systems employ an optical-type digital audio disc from which high quality stereophonic musical signals can be reproduced. The total memory capacity of this kind of compact disc is approximately 500 Mbytes and, thus, the compact disc would seem to lend itself for storage of information other than strictly audio information. Moreover, because the playback apparatus is already in existence then it would be advantageous to employ such compact disc bearing information other than audio information to produce visual information such as charts and statistics using graphics and other pictorial illustrations by means of still picture displays. The use of such compact disc to provide video game apparatus would also seem to be a desirable feature.

Nevertheless, in the known digital audio disc systems, the error correction coding processing is performed on a per byte unit basis by dividing 16 bits of one data sample into two groups, the higher significant eight bits and lower significant eight bits and the interleaving, deinterleaving coding, and decoding processings using Reed-Solomon codes are all carried out on such byte-unit basis. Thus, error correction coding can be relatively easily executed with respect to the digital audio signals and would also seem to be the case with respect to the digital data signals. Nevertheless, a common practice in the digital audio signals in correcting errors is to undertake interpolation processing, such as mean value interpolation, that interpolates a missing data point based on adjacent data points, however, such error processing is not available when reproducing signals other than musical signals, because there is very low correlation among such data. Thus, it is almost mandatory that the error rate of reproduced data be better than that of the reproduced musical signals. In that regard, the error rate which is used in storing digital data is generally required to be around $10^{-13}$ or less, whereas the error rate for an existing compact audio disc is approximately $10^{-11}$.

The reproduction signal processor used in presently known compact audio disc systems is constructed largely utilizing large scale integration (LSI) chip circuitry and, thus, it is desirable that the necessary increase in error rate be realized utilizing substantially the same kind of signal processor circuitry present in the now available compact audio disc players.

One code that is known to have high error rate correction capability that might be used for transmitting digital data via the digital disc is the code formed by the combination of the cross-interleave and the Reed-Solomon code (CIRC), and this code has been adopted for the compact audio disc. In using such error correction approach for data other than audio data, a code similar to this code (CIRC) would be preliminarily imparted to the digital data and then the digital data supplied to an encoder of the compact disc system, however, when the interleave is executed on a byte-unit basis a problem arises in that the address control necessary to perform the interleaving processing becomes overly complicated. On the other hand, if the interleaving were to be carried out on a word-unit basis, the interleaving process is simplified but the informational bit length becomes excessively long and the arrangement of the encoder becomes exceedingly complicated. Moreover, in this such situation the time required to accomplish coding and decoding processing becomes excessively long.

OBJECTS AND SUMMARY OF THE INVENTION

Accordingly, it is an object of the present invention to provide a method of transmitting data using existing digital audio equipment or a digital transmission line in which control for interleave processing is simplified and in which coding and decoding processing is performed on a byte-unit basis. It is another object of the present invention to provide a method transmitting digital data having a lower error rate than presently available in an existing compact audio disc and in which the compact audio disc can be utilized for storage of digital data.

A further object of the present invention is to provide a method of transmitting digital data that can playback not only existing compact audio disc but also compact digital disc on which digital data, such as computer programs, graphics, and the like have been recorded, by the use of the apparatus and hardware presently available for existing compact audio disc recording and playback systems.

In accordance with an aspect of the present invention, a method of transmitting data is provided wherein the cross-interleave Reed-Solomon code pair derived from dividing the data word or audio sample into two user symbols of more significant bits and less significant bits is supplemented with a further error protection code, wherein all processing is done on symbols of relatively short lengths. A symbol typically consisting of eight bits does not present obstacles in the processing thereof, whereas processing a longer signal, for example, 16 bits would be substantially more complicated. The present invention, thus, provides data symbols generated by sector-wise adding to the user symbols a third series of parity symbols in a third Reed-Solomon encoder so that each sector after encoding consists of data symbols equal in number to those of the entire plurality of the first number of data symbols.

Each user word can be divided into a more significant user's symbol and a less significant user's symbol and the sectors can be organized into "planes", in which a first plane of a sector receives the more significant user's symbols of that sector and the second plane receives the less significant player's symbols of that sector. In this way, user's symbols can be distributed in more significant "planes" and in less significant "planes", so that correction of so-called burst errors of increased lengths can be corrected.

Preferably the supplemental error correction code is organized into a first plurality of mutually exclusive first subseries and a second plurality of mutually exclusive second subseries, in that each first subseries (P) is added exclusively to a first part of the user's symbols of the sector being processed relative to all other ones in the first subseries. Each second subseries (Q) is added to an exclusive second part of the user's symbols of the sector being corrected with the associated first subseries of parity symbols relative to all other ones of the second subseries. In this way, symbols of the first part are contained in mutually unique second parts and the product code produced thereby increases the overall error correction capability significantly. Each subseries consists of two parity symbols and even with such limited amount of redundancy good performance has been found to be produced. In that regard it is noted that complications presented in error correction increase vastly with increases in the length of each subseries. Also, an additional multisymbol error detection quantity is preferably included within a sector of data symbols, so that failure of the error protection system is signaled in a reliable fashion. Such error detection quantity is preferably a multi-symbol cyclic redundancy check code quantity, because CRC codes are known to be both reliable and relatively elementary.

The above and other objects, features, and advantages of the present invention will become apparent from the following detailed description of illustrative embodiments thereof, to be read in conjunction with the accompanying drawings.

BRIEF DESCRIPTION OF THE DRAWINGS

FIG. 7 is a representation useful for explaining the interleave relationship of the error correction code performed with respect to the digital data of one section and corresponds to FIG. 6 being shifted or rotated;

DETAILED DESCRIPTION OF PREFERRED EMBODIMENTS

Figure 1:
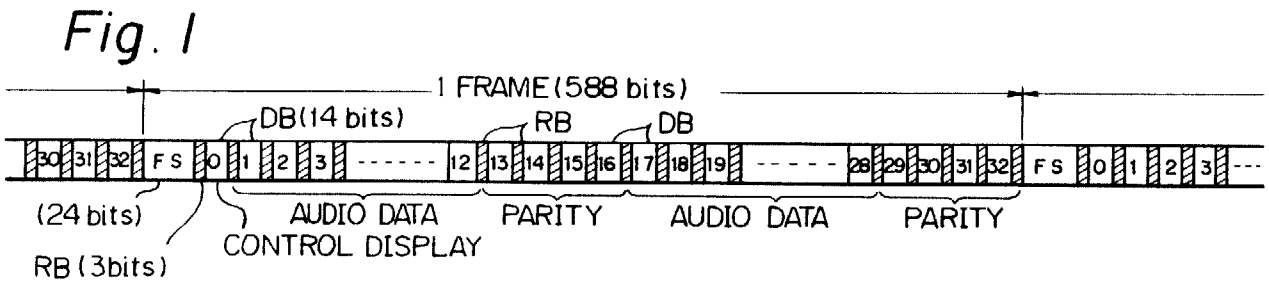
FIG. 1 is a representation of the data format of one frame of a recording signal on a compact digital disc.

The arrangement of data where the signals that are recorded on a compact disc represent audio data, such as in case of the known compact audio disc, is described with reference to FIGS. 1 and 2. While specific numbers are described it will be apparent the number of bits within a symbol, the number of symbols in a sector or frame, or the numbers of parity symbols added in successive encoding stages could be different FIG. 1 represents a data stream recorded on a compact disc, in which one FRAME comprises 588 bits of record data, and each FRAME has at its head end a frame synchronization pattern called a frame sync pulse FS that is made up of a specific bit pattern. The frame sync pulse FS is followed by three DC-restriction or merging bits RB, which are shown shaded in FIG. 1, and followed thereafter by the 0th-32nd data segments DB, each consisting of 14 bits. The data segments DB and three DC-restriction bits RB are subsequently recorded alternately. The 0th bits among these data bit segments DB are denoted as a subcoding signal or as user's bits and are used to control the playback of the disc and to display information relative thereto. The 1st-12th and 17th-28th data bits DB are assigned for the audio data in the main channel, and the remaining 13th-16th and 29th-32nd data bits DB are assigned for the parity data of the error correction code in the main channel. Each of the data bit segments DB consists of 14 bits into which the 8-bit data has been converted by the well-known 8–14 conversion during the recording process.

Figure 2:
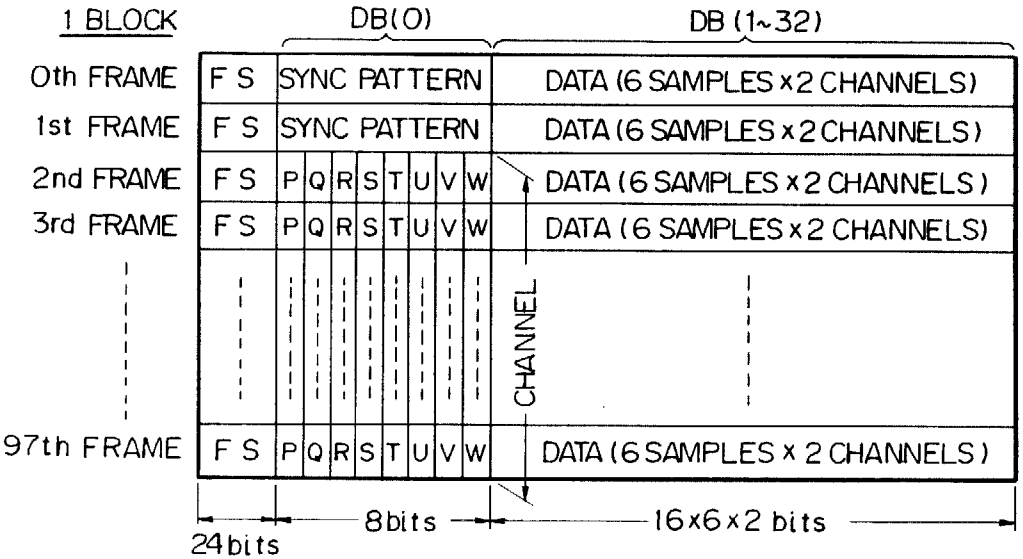
FIG. 2 is a representation of the data format of one block of a recording signal on a compact disc utilizing the frame format shown in FIG. 1.

The manner in which the 98 FRAMEs are sequentially arranged in parallel, wherein each of the data bit segments DB is represented by eight bits and the DC-restriction bits are excluded, is shown in FIG. 2. The subcoding signals P to W in the 0th and 1st FRAMEs form the sync patterns and are provided having predetermined, known bit patterns. In the 2nd to 97th frame the subcoding signals P to W are divided vertically into so-called channels. The CRC codes used for error detection are inserted in the Q channel of the last 16 FRAMEs of the total 98 FRAMEs.

The P-channel represents a signal used as a flag to indicate the presence of a music program or a pause and in this embodiment has a low level throughout a music program and a high level throughout a pause. The P-channel also has pulses of 2-Hz period to indicate the lead-out section. Thus, it is possible to select and play back a specified one of a number of music programs by detecting and counting this signal in the P-channel. The Q-channel permits a more sophisticated control of this type, for example, when the Q-channel information is stored in a microcomputer, typically included in the audio disc playback apparatus, it is possible to locate and shift quickly from one music program to another during playback. Thus, respective ones of the recorded music programs may be selected at random. The other R through W-channels can be used to provide further explanation or information concerning the recorded programs, for example, by means of the audible voice of the composer or author.

Among the 98 bits in the Q-channel, the first two bits are used for a sync pattern; the next four bits are used for control bits; the further next four bits are used for address bits; with the following 72 bits used as data bits; and finally a CRC code for error detection is added at the end. A track number code TNR and an index code X are included in the 72 bits that represent the data bits, with track number code TNR being adapted to be varied from 00 to 99, and the index code X likewise being changed from 00 to 99. In regard to the data in the Q-channel, there is included a time indication code representing the time duration of a particular music program and an associated pause, and a time indication code indicating the absolute time that changes continuously from the beginning or lead-in of the program area of the compact disc to the end at the outermost rim thereof. These time indication codes consists of two-digit codes indicating minutes, seconds, and frame. In this embodiment, a second is divided into 75 FRAMEs. In order to access a compact disc on the basis of a unit that is shorter than a music program, such as would be the case when in digital data is recorded, a time indication code based on the above-mentioned absolute time is used. In this embodiment, when the digital data is recorded as information in the main channel, the data arrangements of the subcoding signals in the P and Q-channels are identical to those of the compact disc. As will be seen below, after decoding of the first and second Reed-Solomon codes and the appropriate descrambling, the data is grouped into a sector.

Figure 3:
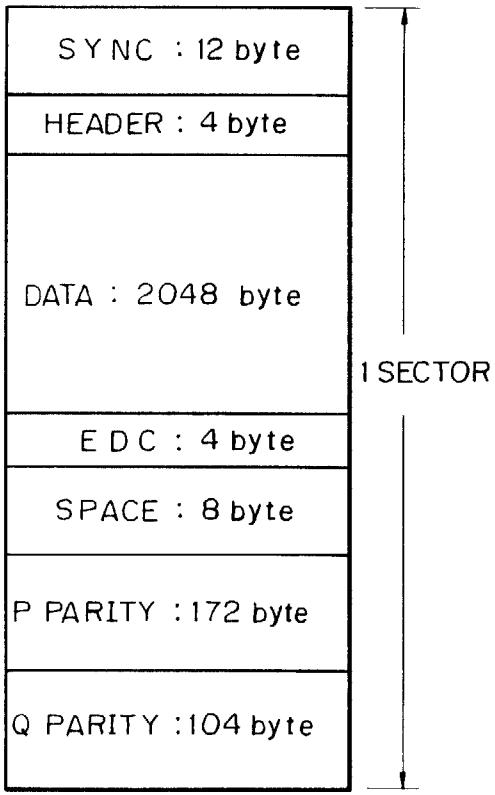
FIG. 3 is a representation of the data format of one sector of a recording signal on a compact digital disc employing frames as shown in FIG. 2.

In FIG. 3 a recording format for the digital data is shown, in which one SECTOR of the digital data consists of (588×4 bytes=2352 bytes), and which represents the function of the respective elements of a sector One SECTOR comprises: a sector sync signal of 12 bytes; a header of four bytes; user's data of 2048 bytes; an error detection code, for example, a CRC code, of four bytes, which is not the same as the 16-bit CRC code in the Q-channel shown in FIG. 2; a space for expansion of eight bytes; and P-code parity (referred to hereinafter as P-parity) of 172 bytes and a Q-code parity (referred to hereinafter as Q-parity) of 104 bytes of the third Reed-Solomon code of the present invention. One SECTOR is constituted such that only the data that will be finally needed can be fetched.

Figure 4:
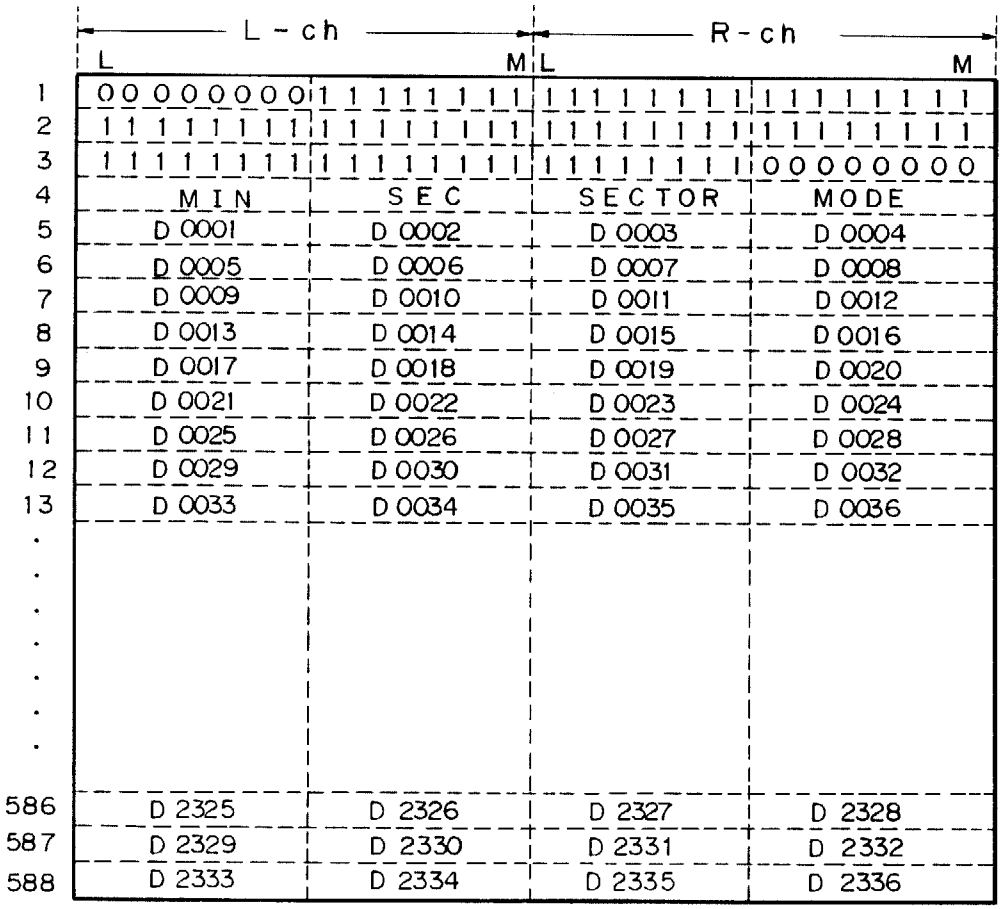
FIG. 4 is a representation of the arrangement of one sector on a byte-unit basis.

FIG. 4 shows the arrangement of one SECTOR in more detail, in which the left channel and right channel correspond to the data samples in the left and right channels of stereophonic musical data. In each channel, one word consists of 16 bits, with L denting the least significant bit (LSB) and M indicating the most significant bit (MSB). As described above, in the case of stereophonic musical data, data of 24 bytes (6×2×2=24 bytes) is typically recorded in the interval that is specified by the frame sync signal. Therefore, when the digital data is recorded in the same signal format as the stereophonic musical data, for example as shown in FIG. 1, one BLOCK (2352 bytes) is recorded in the 0th to 97th FRAMEs, as they are numbered according to the subcode content. Accordingly, it is seen that the digital data can be completely recorded without exceeding 98 FRAMEs, which is the period at which the subcoding signal changes. The digital data DB of a sector has a length corresponding to the interval between two successive zero-frame synchronization patterns of the subcode signal. There is no interleaving between different sectors.

The first byte of the digital data of one BLOCK has all bits at "0"; the following ten bytes have all bits at "1"; the further next one byte has all bits at "0". This 12-byte interval is denoted as a sector sync signal and is indicative of the head of the digital data of one BLOCK.

After this sector signal, headers relating to minute, second, sector, and mode, each consisting of one byte, are added. These headers are the addresses of one SECTOR and in this embodiment 75 SECTORS correspond to one second, just as 75 FRAMEs corresponded to one second in the music program situation. The mode data is used to signify the kind of data contained in one SECTOR, for example, and in FIG. 4, D0001 to D2336 represent the byte numbers of one SECTOR, exclusive of the sector sync signal and the headers. Byte numbers D0001 to D2048 are employed for the user data; byte numbers D2049 to D2052 are employed for the error detection code; byte numbers D2053 to D2060 provide the expansion space; byte numbers D2061 to D2232 are for the P-parity; and byte numbers D2233 to D2336 are for the Q-parity.

Figure 5:
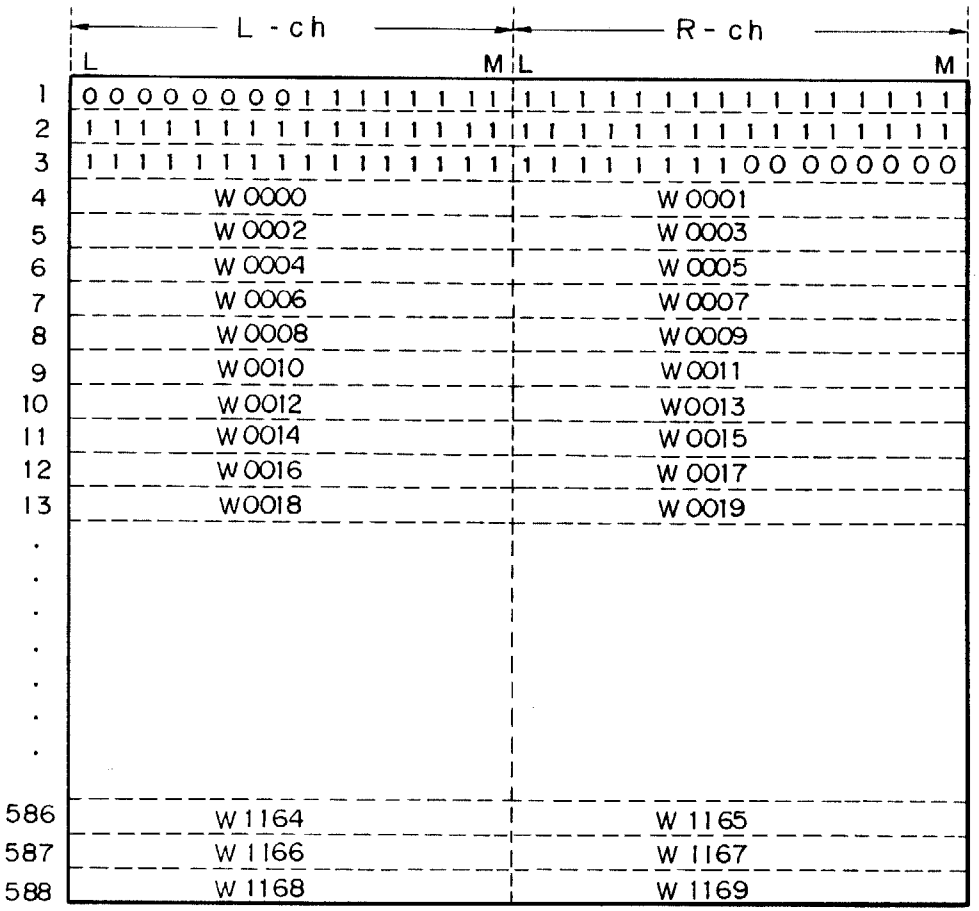
FIG. 5 is a representation of the arrangement of one sector on a word-unit basis.

In FIG. 5 an arrangement of one SECTOR expressed on a word-unit basis is represented for use in explaining the code arrangements of the error detection code and of the error correction code. In FIG. 5, $W_i$ is used to indicate a word number, and word numbers W0000 and W0001 are employed for the headers; word numbers W0002 to W1025 are employed for user data; word numbers W1026 and W1027 are employed for the error detection code; word numbers W1028 to 1031 are for a space; word numbers W1032 to W1117 are for the P-parity; and word numbers W1118 to W1169 are for the Q-parity. Coding processing for the error detection code is performed relative to the headers and to the user's data (word numbers W0000 to W1027), while coding processing for the error correction code is carried out relative to the 1170 words (2340 bytes) formed by word numbers W0000 to W1169, excluding the 12 bytes making up sector sync signal. The error correction code covers the header and user data (W000–W1027), the P-parity and Q-parity itself, and also the CRC bits and the space, but not the synchronization bytes.

A CRC code that is suitable for use as the error detection code can have, for example, the following generating polynominal, P(x). $P(x)=(x^{16}+x^{15}+x^2+1)(x^{16}+x^2+x+1)$. The remainder of the division of the polynominal over the Galois field GF ($2^8$) on the header plus user data provided by this generating polynomial becomes the CRC code having four bytes. This error detection code is used to check the final reliability after performing error correction on the signal reproduced from the disc. In addition to this, the error detection code may also be used to prevent incorrect error correction when such error correction is performed.

Each one of the words numbered W0000–W1169 forming one SECTOR is divided into two kinds of bytes, that is, into higher significant bytes including the most significant bit M and lower significant bytes, including the least significant bit L. The 1170 higher significant bytes are grouped into a so-called data plane, while the 1170 lower significant bytes are grouped into a data plane, and the error correction coding processing is executed for each of these two different data planes. Nevertheless, the coding processings performed relative to the respective data planes, consisting of the higher significant bytes and lower significant bytes, are the same.

Figure 6:
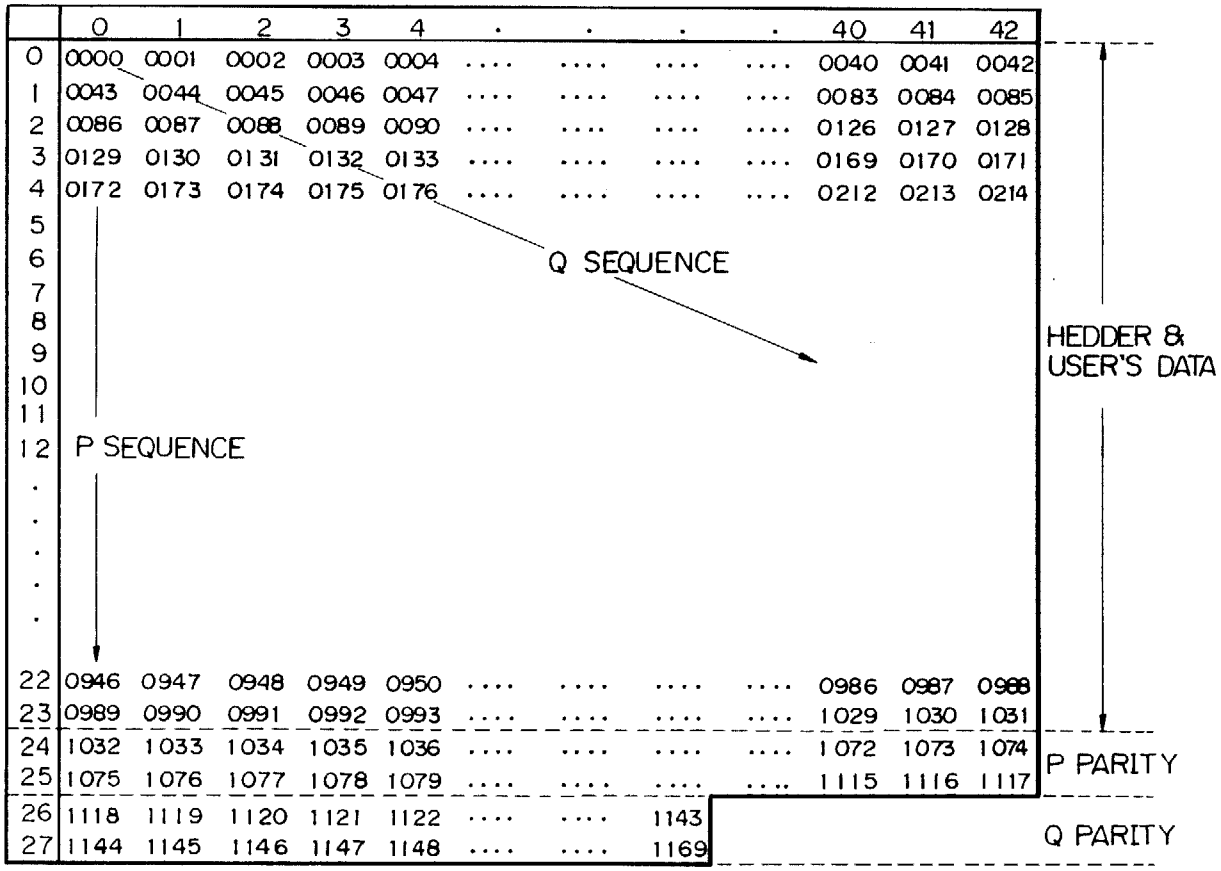
FIG. 6 is a representation useful for explaining the interleave relationship of the error correction code performed with respect to the digital data of one sector.

FIG. 6 is a diagrammatic representation of the coding processing relative to one of the data planes, made up either of the higher or lower bytes. This data plane consists of 1032 bytes formed of the header and user data, and these 1032 bytes are two-dimensionally arranged in a matrix of 24 rows×43 columns. The respective bytes are identified by individual word numbers for convenience and are arranged sequentially from the first row on. These sector-wise organized bytes are encoded into a further set of two Reed-Solomon codes.

The matrix-like representation of FIG. 6 shows the interleaved of the two codes in different directions in the matrix. The coding processing for error correction, in which the completion-type cross-interleave and Reed-Solomon code are combined, is carried out with respect to this 24×43 data plane. This error correction code is subjected to interleave processing such that symbols each consisting of one byte are included in two data series arranged in the mutually different directions on this 1032 byte data plane. The coding processing using the Reed-Solomon code is performed for every code series.

The coding processing using the Reed-Solomon code of (26, 24), in which one byte is used as one symbol, is performed for every one of the 24 bytes located in each column of the forty-two columns. The P-parity is added as two bytes located at the lowermost positions in each column. Therefore, the code series including the P-parity words (referred to hereinafter as the P-series) consists of 26 symbols. Then, for the Reed-Solomon code of (26, 24) over GF ($2^8$), for example, the following polynomial P(x) is used:

$$P(x)=x^8+x^4=x^3+x^2+1$$

Assuming that the associated primitive element "a" over the field GF ($2^8$) is a=(00000010), the latter bit being the least significant and the generator for the code is given by the product. $(x-a^0)(x-a^1)$, then the parity check matrix HP can be shown as:

$$HP=\begin{bmatrix} 1 & 1 & 1 & \dots & 1 & 1 \\ a^{25} & a^{24} & a^{23} & \dots & a^1 & 1 \end{bmatrix}$$

If the reproduced P-series after decoding is called VP, then the parity symbol PO=D(43×24+N) and P1=D(43×25+N (N=0,1,2, . . . , 41,42) will satisfy the following equation.

$$HP \times VP = 0 \text{ where,}$$

$$VP=\begin{bmatrix} D(43\times 0+N) \\ D(43\times 1+N) \\ D(43\times 2+N) \\ D(43\times 3+N) \\ \cdot \\ \cdot \\ \cdot \\ D(43\times 21+N) \\ D(43\times 22+N) \\ D(43\times 23+N) \\ D(43\times 24+N) \\ D(43\times 25+N) \end{bmatrix} \begin{matrix} (N=0\dots 42) \\ (M=0\dots 25) \end{matrix}$$

As an example, when N=0, one reproduced P-parity consists of [D0000, D0043, D0086, D0129, D0172, . . . , D0946, D0989, D1032 (=PO), D1075 (=P1)], all of which are located in the first column.

On the other hand, when the coding processing uses the Reed-Solomon code of (45, 43), in which one byte is used as one symbol, and is carried out for every 43 bytes located in the oblique direction (diagonal Q sequence) on the data plane. In such case, the Q-parity is added as two bytes located in the 27th and 28th rows. Therefore, the Q-series consists of 45 symbols. For this second Reed-Solomon code of (45, 43) over the field GF ($2^8$), the following generator polynomial P(x) can be used, for example:

$$P(x)=x^8+x^4+x^3+x^2+1$$

Assuming that a primitive element "a" over GF ($2^8$) is a=[00000010], then the parity matrix HP will be:

$$HP=\begin{bmatrix} 1 & 1 & 1 & \dots & 1 & 1 \\ a^{44} & a^{43} & a^{42} & \dots & a^1 & 1 \end{bmatrix}$$

Denoting the reproduced Q-series as VP, the parity symbols Q0=D(43×24+N) and Q1=D(44×26+N) will satisfy the equation:

$$HP \times VP = 0 \text{ where,}$$

$$VP=\begin{bmatrix} D(44\times 0+43\times N) \\ D(44\times 1+43\times N) \\ D(44\times 2+43\times N) \\ D(44\times 3+43\times N) \\ D(44\times 4+43\times N) \\ D(44\times 5+43\times N) \\ \cdot \\ \cdot \\ \cdot \\ D(44\times 40+43\times N) \\ D(44\times 41+43\times N) \\ D(44\times 42+43\times N) \\ D(43\times 26+N) \\ D(44\times 26+N) \end{bmatrix}$$

Assuming that N=(0, 1, 2, 3, . . . , 24, 25) and M=(0, 1, 2, 3, . . . , 41, 42), and assuming the relationship (44×M+43+N)≦1117 is present, then (44×M+43×N) can be calculated as (44×M+43×N−1118).

To aid in understanding the interleave relationship of the Q-series, N=(0, 1, 2, . . . , 24, 25) is set into the vertical direction and M=(0, 1, 2, . . . , 42, 42) is set into the horizontal direction and the arrangement of the 1118 symbols in FIG. 6, including the P-parity, is rearranged, to obtain an arrangement as shown in FIG. 7.

In FIG. 7, with respect to FIG. 6, the column for M=1 is rotated upwardly by one position, for M=2 by two positions, and so on. In this example the rows in FIG. 7 each constitute their own Q-series. Each column forms a (now rotated) P-series, except for the Q0, Q1 columns. Thus, FIG. 7 shows that arrangement of a quasi-product code comprising a (26, 24) Reed-Solomon code in the vertical direction and a (45, 43) Reed-Solomon code in the horizontal direction.

Each horizontal row in FIG. 7 forms one Q-series, for example, when N=(0), one Q-code series is formed by [D0000, D0044, D0088, D0132, D0176, . . . , D0642, D0686, D0730, D1118 (=Q0), D1144 (=A1)]. On the other hand, each vertical column forms the P-series, so that FIG. 7 shows an arrangement of product codes that were subjected to the coding processing using the (26, 24) Reed-Solomon code in the vertical direction and that were subjected to the coding processing using the (45, 43) Reed-Solomon code in the horizontal direction.

Therefore, because together these two Reed-Solomon codes have 2-symbol parity, even when no error flag exists, up to one-symbol error can be corrected. Also, when the error location is known because of an error flag, up to two-symbol error can be corrected. To provide this error flag, the result of the decoding of the CIRC (Cross-Interleaved Reed-Solomon Code), which is used as a standard code with regard to the digital disc, can be employed. Thus, as seen in FIG. 7, by alternately performing decoding of the Reed-Solomon code in the vertical direction (referred to as P-decoding) in the horizontal direction (referred to as Q-decoding), all of the error patterns can be corrected, except for the case where three or more symbols become error symbols, with respect to any of the P-series and Q-series. Such alternate decoding is seen as P-decoding, then Q-decoding, then P-decoding, and so on. Further, because cross-interleave processing has been performed, the error correcting capability is even more improved by such dispersing of burst errors.

The error correction coding processing as described above is similarly executed with regard to the two data planes consisting of the higher significant bytes and the lower significant bytes that were grouped by dividing the total 1118 words of the header and user data of one SECTOR into the two data planes of 1118 bytes each. The responsive data planes to which the error correction coding processings were performed are synthesized and the sector sync signal is further added to them, to obtain the arrangement of one SECTOR as represented in FIG. 4 or FIG. 5. In place of the audio data, this one SECTOR is supplied to the encoder for the CIRC code of the digital disc and is subjected to the error correction coding processing; furthermore, it is converted to the record data as shown in FIG. 1, based on the audio disc format. This record data is then supplied to the cutting machine conventionally used in the manufacture of these digital discs. Secondary copies can then be made by the standard replication process.

Figure 8:
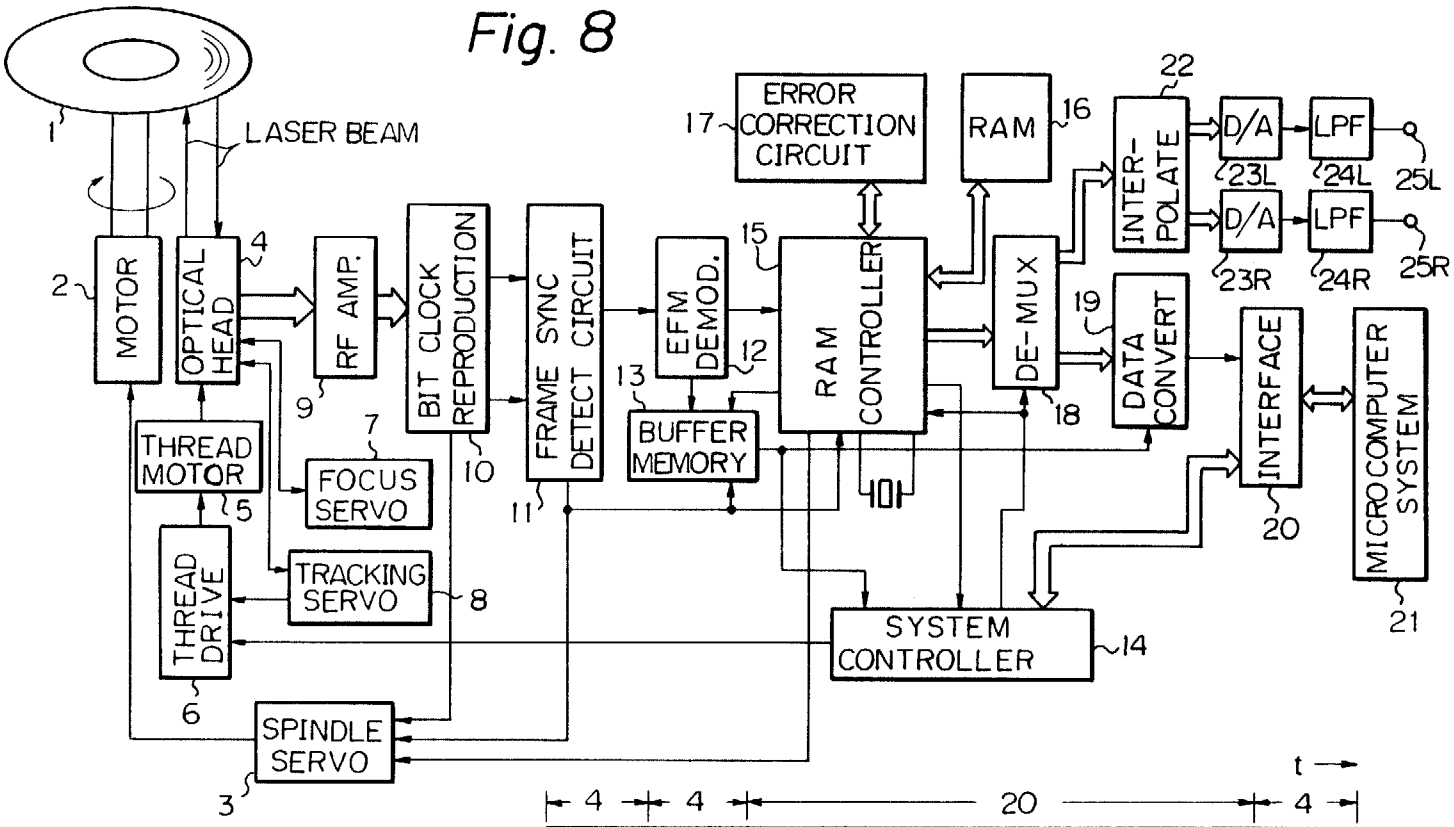
FIG. 8 is a block diagram of a decoder apparatus according to an embodiment of the present invention.

Referring now to FIG. 8, a digital disc 1 on which a digital signal having the above-described format has been spirally recorded is rotated by a spindle motor 2, which is controlled by a spindle servo circuit 3, so that disc 1 rotates at a constant linear velocity. An optical head 4 for reading the recorded digital signal comprises a laser generator for generating a laser beam for readout, a beam splitter, an optical system such as an objective lens and the like, and a photo sensitive element to receive the laser beam reflected by the disc 1, none of which are shown in FIG. 8 in the interest of clarity and to avoid unnecessary detail. Optical head 4 can be moved in the radial direction relative to disc 1 by a thread-feed (lead screw) motor 5 driven by a thread-drive circuit 6. The optical head 4 is arranged for deviation of movement in two directions: the direction perpendicular to the surface of disc 1 whereon the signals have been recorded; and the direction that is parallel to such surface. Optical head 4 is controlled so that the focusing and tracking of the laser beam can be always achieved in playback of the disc and to accomplish this a focus servo circuit 7 and a tracking servo circuit 8 are provided. Optical head 4 is further equipped to aid in this regard with a focus error detecting section consisting of a combination of, for example, a cylindrical lens and a four-split detector, and a tracking error detecting section using three laser spots, none of which are shown in FIG. 8 in the interest of clarity and brevity.

The signal produced by optical head 4 is fed to an RF amplifier 9, and the output signal of RF amplifier 9 is fed to a clock extracting circuit 10 that separates the clock signal and the data signal. The data and clock outputs of clock extracting circuit 10 are fed to a frame sync detecting circuit 11.

The digital signal that was recorded on the disc 1 can be modulated according to any of the known techniques and in this embodiment was modulated according to the EFM-modulation method, which is a known method of block-converting 8-bit data to a patter of 14 bits. This expansion to 14 bits is performed so that the minimum transition time between binary states of the modulated signal is lengthened, thereby reducing its low-frequency component. The bit clock signal output from the clock extracting circuit 10 is fed to frame sync detecting circuit 11 and the frame sync signal, detected by frame sync detecting circuit 11, and the bit clock signal are supplied to a digital EFM demodulator 12, where the appropriate demodulation is performed. This combined signal is also fed to spindle servo circuit 3.

The subcoding signal is separated by the digital demodulator 12 and is fed to system controller 14 through a buffer memory 13. System controller 14 includes a central processing unit (CPU, not shown) and among other things controls the rotation of disc 1, the thread-feed operation, and the readout operation of optical head 4. The control commands necessary to accomplish these functions are provided from a microcomputer system 21 and are supplied through an interface 20, described below, to system controller 14. In other words, system controller 14 uses the subcoding signal to perform the necessary control in order to read out the digital signal from disc 1.

The main digital data output from digital demodulator 12 is supplied through a RAM controller 15 to RAM 16 and to an error correcting circuit 17. The signal processing necessary for removal of time base variations and for error correction are executed by the combination of controller 15, RAM 16, and error correcting circuit 17, so that a corrected main digital data is obtained at the output of RAM controller 15 and is fed to a demultiplexer 18. The demultiplexer 18 is controlled in response to whether the disc being played back is a compact audio disc having recorded thereon stereophonic musical signals (without the Reed-Solomon code) or is a digital data disc used for storage of digital data and having this additional sector-wise code. Thus, the output of demultiplexer 18 is switched between two channels by system controller 14. For example, by use of the Q-channel control bits of the subcoding signal that are recorded in the lead-in track of disc 1, a discrimination can be made to determined whether the disc being played back contains stereophonic musical signals or was used for the storage of digital data. A control signal indicative of the results of such discrimination of the kind of disc and a control signal representative of the change-over of the output path are supplied to RAM controller 15. The reproduced output from the disc having stored thereon digital data is then subjected to the additional error correcting operation as described above. A data converter 19 is connected to the output path, which is selected when the digital disc is played back, and in addition to the reproduced digital data the reproduced subcoding signal is also supplied from buffer memory 13 to data converter 19, wherein the reproduced data is converted to a serial signal.

Figure 9:
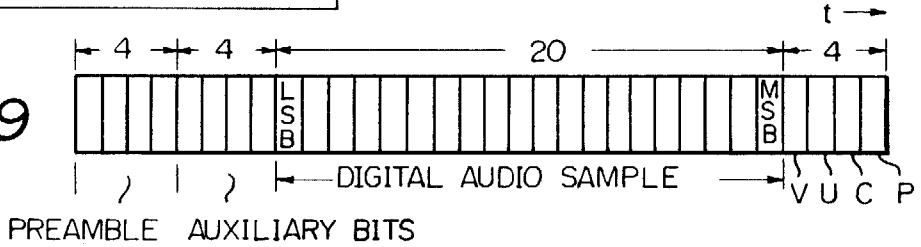
FIG. 9 is a representation of the format of the signal when the reproduction data from the disc is transmitted.

FIG. 9 is a representation of an example of a word format of the serial signal that is produced by data converter 19 and in this serial signal, one word consists of 32 bits in which the first four bits form a preamble, the next four bits are auxiliary bits of data, and the next 20 bits are for data. In the case of digital data in which one word consists of 16 bits, such 16 bits are inserted from the least significant bit (LSB) end. An additional four bits are added after the digital data and in these four bits, the bit indicated at V is the flat representing whether the word is valid or not; the U bit is a bit of the subcoding signal; the C bit is the bit for channel discrimination; and the P bit is the parity bit. The U bit of the subcoding signal is inserted one bit by one bit in each word format and is sequentially transmitted.

The foregoing word format is constituted in consideration of the audio data and is supplied to interface 20 at the next stage and is converted to the data format for a standard computer. This data can be taken out through the output port (not shown) in interface 20. In addition, the data for system controller 14 is supplied from microcomputer system 21 through interface 20. The microcomputer system 21 designates readout addresses and provides the drive control signals, such as the start signal, through interface 20 to system controller 14.

An interpolator 22 is connected to the output path of the demultiplexer 18, which is selected when the disc being played back contains stereophonic musical signals, thereby allowing the erroneous data that otherwise could not be error-corrected to be corrected. The stereophonic musical signals are divided into left and right channels by interpolator 22, and the data in the respective channels are further converted to analog signals by digital-to-analog (D/A) converters 23L and 23R. These analog signals are smoothed in low-pass filters 24L and 24R and are fed out at output terminals 25L and 25R, respectively.

In one embodiment of the present invention, time base variations of the subcoding signal can be removed by the buffer memory 13, and this time base correction is similar to the time base correction carried out on the digital signal in the main channel by RAM controller 15 and RAM 16. More specifically, RAM controller 15 forms the write clock in synchronization with the reproduction signal from the detected frame sync signal, and the digital signal is written into RAM 16 in response to this write clock. On the other hand, when the digital signal is read out from RAM 16, the read clock is formed by using the output of a crystal oscillator connected to RAM controller 15. Because these write and read clocks are used to write and read out the subcoding signal into and from buffer memory 13, the subcoding signal read out from buffer memory 13 includes no time base variation, thereby preventing the situation in which the time relationship between the subcoding signal and the digital signal in the main channel will have been changed due to variations in time base.

In this embodiment, upon playback of the disc having digital data stored thereon, the read command for a predetermined address is first executed by microcomputer system 21. This address is the code itself for the display of the absolute time in the Q channel and is supplied to system controller 14 through interface 20. System controller 14 controls thread-drive circuit 6, thereby allowing optical head 4 to be moved to the location near the desired readout location, while checking the subcoding signal reproduced by optical head 4. In this example, reproduction is started at a location that is spaced apart from the true location by a few BLOCKs in order to prevent an apparent malfunction such that the accessing operation does not end without reproducing the set subcoding signal, because an error is included in the reproduced subcoding signal. The desired BLOCK is caught by either method, whereby the reproduced subcoding signal coincides with the designated address or whereby the frame sync signal is counted by starting reproduction from a location near to the correction subcoding signal.

Figure 10:
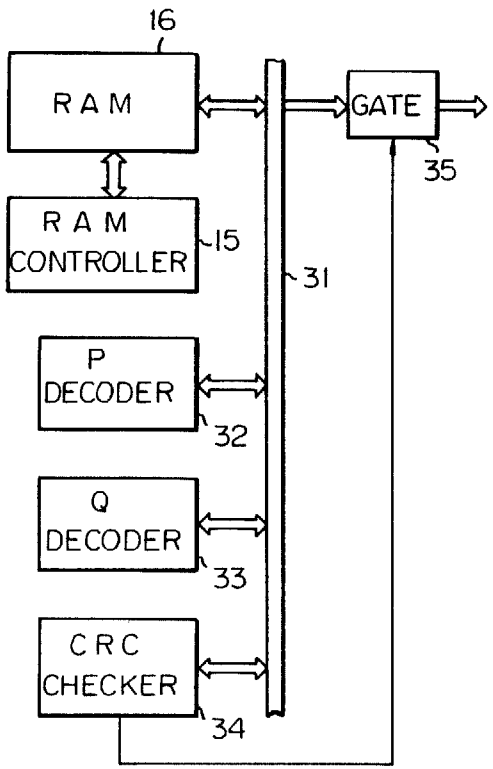
FIG. 10 is a block diagram of an error correcting decoder for use in correcting the errors in digital data of one sector.

FIG. 10 is a block diagram of an embodiment of an error correcting circuit for use when a disc having digital data stored thereon is played back. This error correcting circuit is used both for discs containing audio signals and for discs storing digital data and for simplicity the decoder for the CIRC code is omitted. The reproduced data excluding the sector sync signal of one SECTOR that has been stored in the RAM 16 is the data after the decoding of the CIRC code, and the error flag indicating the presence and absence of an error is added to each symbol. Each symbol is read out from RAM 16 together with the error flag and is supplied through a data bus 31 to a P-decoder 32 for every P-series of 26 symbols. P-decoder 32 performs the decoding using the (26, 24) Reed-Solomon code for carrying out the two-symbol error correction in one P-series by use of the error flag obtained by the decoding of the CIRC code. The symbols after this decoding are written in RAM 16, and in this case, the error flag relating to the symbol for which the error was corrected by P-decoder 32 is cleared. After completion of the P-decoding with respect to one SECTOR, the data read out from RAM 16 is supplied through data bus 31 to a Q-decoder 33.

The deinterleave is performed in response to the address control of RAM 16, and in the Q-decoder 33 the decoding using the (45, 43) Reed-Solomon code for carrying out the correction of two-symbol error in one Q-series is performed for every Q-series of one SECTOR. The error flag relative to the symbol for which the error was corrected by this decoding is then cleared. Next, P-decoding is again performed and then Q-decoding is carried out, so that after P-decoding and Q-decoding are alternately performed twice, the reproduction digital data following error correction from RAM 16 is fed to a CRC checker 34, where the error detection is performed. The result of the error detection is supplied to an output gate 35, in which the error flag is set relative to data for which it was determined that an error exits.

The error detection result from CRC checker 34 can be also used for the error correction in the P-decoder 32 and Q-decoder 33. Upon error correction, P-decoder 32 and Q-decoder 33 use the error flag that was generated in the decoding of the CIRC code. Therefore, by referring the error detection result to CRC checker 34 at the time of P-decoding and Q-decoding, it is possible to prevent an erroneous correcting operation when the error flag of the CIRC code is itself not correct.

Figure 11:
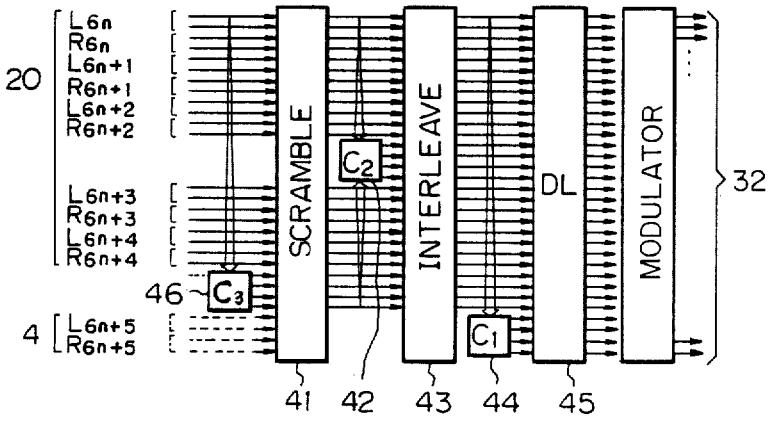
FIG. 11 is a block diagram of an encoder according to another embodiment of the present invention.
Figure 12:
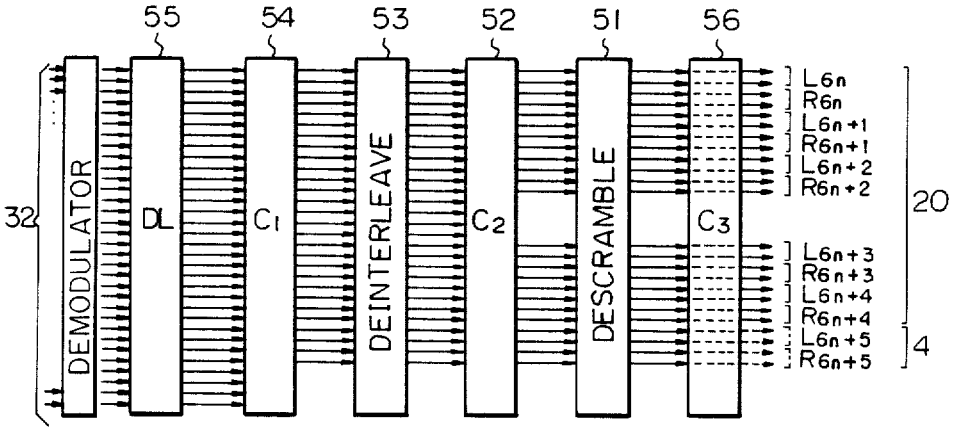
FIG. 12 is a block diagram of a decoder according to another embodiment of the invention.

Another embodiment of the present invention is shown in FIGS. 11 and 12, in which a new encoder and decoder are added to the encoder and decoder of the CIRC code which is applied to the disc for playing back digital audio signals. More specifically, FIG. 11 shows an arrangement of an encoder for the data such as might be recorded on a master disc when digital discs are manufactured, and this encoder and the decoder, shown in FIG. 12, can handle both possible situations where the digital audio signals are recorded and reproduced and where the digital data signals are recorded and reproduced. In addition, the particular encoder or decoder is actually made up of the RAM, RAM controller, and error correcting encoder or error correcting decoder as already described above, however, in FIGS. 11 and 12, the circuit blocks are arranged in accordance with the sequence of the signal processings in order to aid in understanding. When the digital audio signals are recorded and reproduced, the $C_3$-encoder 46 in FIG. 11 and the $C_3$-decoder 56 in FIG. 12 are not used.

The coding and decoding processings of the CIRC code that are executed with respect to the digital audio signals will first be explained. In FIG. 11, a scramble circuit 41 interleaves the respective even-numbered sample data $L_{6n}$, $R_{6n}$, $L_{6n+2}$, $R_{6n+2}$, $L_{6n+4}$, $R_{6n+4}$ and odd-number sample data $L_{6n+1}$, $R_{6n+1}$, $L_{6n+3}$, $R_{6n+3}$, $L_{6n+5}$, $R_{6n+4}$ in the left and right (L and R) channels and converts the locations of the symbols in one FRAME. Sixteen bits of one sample data are divided into two groups consisting of the higher significant eight bits and lower significant eight bits and are subjected to the coding processing, whereby one symbol consists of eight bits. Twelve data samples (24 symbols) of musical data are supplied to scramble circuit 41 and 24 symbols., which are outputted from scramble circuit 41, are supplied to $C_2$-encoder 42 and are encoded using the Reed-Solomon code of (28, 24).

The four symbol parity produced as an output of $C_2$-encoder 42 and the data of 24 symbols are supplied to an interleave circuit 43 for improved the burst error correcting capability by interleaving the recording locations of the 28 symbols included in one code series of the $C_2$ code. The 28 symbols that are output from interleave circuit 43 are supplied to a $C_1$-encoder 44 and are encoded using the Reed-Solomon code of (32, 28). The 32 symbols include four parities formed by $C_1$-decoder 44 and are supplied to a delay circuit 45 that serves to delay only the odd-number symbols in one FRAME. The subcoding signal of one symbol is added to the 32 symbols that are output from delay circuit 45 and thereafter the 33 symbols are EFM-modulated. Following such EFM-modulation, the frame sync signal is added to obtain the recording signal, as shown in FIG. 1.

The signal that is reproduced from the disc is EFM-demodulated and then it is supplied to the decoder for the CIRC code, shown in FIG. 12, and is subjected to the error correction processing. The 32 symbols in one FRAME are supplied to a delay circuit 55, wherein only the even-numbered symbols are delayed in order to cancel the delays imparted by delay circuit 45 of the encoder. Then, they are supplied to a $C_1$-decoder 54 and subjected to the error correction processing using the Reed-Solomon code of (32, 28). The corrected data and pointers are supplied to a deinterleave circuit 53 that performs the required processing to return the interleave executed by the interleave circuit 43 to the original state. The output of deinterleave circuit 53 is supplied to a $C_2$-decoder 52.

The pointer of each symbol produced by the $C_1$-decoding is also subjected to the deinterleave processing similar to the data in the deinterleave circuit 53, and the deinterleave is carried out by a method, whereby the RAM controller generates predetermined addresses in the RAM. The pointers formed by $C_1$-decoder 54 are written into the memory area of a part of the RAM and are subjected to the same address control as that for the data. In the $C_2$-decoder 52, the decoding using the Reed-Solomon code of (28, 24) is carried out by use of the pointers produced by the $C_1$-decoding. The data and pointers after the error correction from $C_2$-decoder 52 are supplied to a descramble circuit 51 that performs an operation opposite to that performed by scramble circuit 41, and reproduction of the data of 24 symbols having the original sequence is obtained as the output of descramble circuit 51.

When digital data signals other than the digital stereophonic audio signals are recorded, the four symbols corresponding to the audio sample data $L_{6n+5}$ and $R_{6n+5}$ are not supplied but the 20 symbols are supplied to the $C_3$-encoder 46. $C_3$-encoder 46 performs the coding processing using the Reed-Solomon code of (24, 20) and generates the four-symbol parity symbols. These four-symbol parity symbols are supplied to scramble circuit 41 as the data corresponding to the audio sample data $L_{6n+5}$ and $R_{6n+5}$. The subsequent coding processing is similar to that for the foregoing digital audio signals.

In addition, the 32 symbols in one FRAME reproduced from the digital disc are subjected to the decoding processing by delay circuit 55, $C_1$-decoder 43, deinterleave circuit 53, $C_2$-decoder 52, and descramble circuit 51 in a manner similar to the decoding with respect to the digital audio signals. The output of descramble circuit 51 is supplied to the $C_3$-decoder 56. $C_3$-decoder 56 is the decoder using the Reed-Solomon code of (24, 20) corresponding to $C_3$-encoder 46 and can correct the two-symbol error included in one coded series. Further, $C_3$-decoder 56 can correct up to a four-symbol error by use of the error flag formed by the CIRC decoding. Thus, when the disc for the storage of digital data is played back, data wherein one FRAME consists of 20 symbols is reproduced.

In the above embodiment, the $C_3$-encoder 46 can be interposed between scramble circuit 41 and $C_2$-encoder 42, while the $C_3$-decoder 56 can be interposed between the $C_2$-decoder 52 and descramble circuit 51. Nevertheless, because the CIRC encoder and CIRC decoder already have circuit arrangements suitable for large scale integration, as shown in FIGS. 11 and 12, it is preferable to adopt an arrangement such that $C_3$-encoder 46 and $C_3$-decoder 56 are respectively connected to the input terminal of the CIRC encoder and to the output terminal of the CIRC decoder, thus there is no need to design another LSI integrated circuit chip.

Although illustrative embodiments of the present invention have been described in detail above with reference to the accompanying drawings, it is understood that the invention is not limited to those precise embodiments, and that various changes and modifications can be effected therein by one skilled in the art without departing from the scope or spirit of the invention, as defined by the appended claims.

What is claimed is:

1. An information transmission method with error correction for user words formed in the information, comprising the steps of:

dividing each user word into first and second multiple bit user symbols of equal length;

introducing a first plurality of data symbols into a first Reed-Solomon encoder for adding thereto respective ones of a first series of parity symbols, in which said data symbols are generated from said first and second user symbols;

interleaving output symbols of the first encoder by means of respective different delay times;

introducing a second plurality of data symbols in a second Reed-Solomon encoder for adding thereto respective ones of a second series of parity symbols, to produce a third plurality of code symbols;

modulating said third plurality of code symbols into channel symbols for introduction into a record medium for subsequent decoding therefrom;

wherein said data symbols are generated in a sector-wise fashion by adding to said user symbols a third series of parity symbols in a third Reed-Solomon encoder; and wherein each sector after encoding consist of a plurality of data symbols equal in number to the entire plurality of said first plurality of data symbols.

2. A method according to claim 1, wherein the step of dividing each user word includes dividing each user word into a more significant user symbol and a less significant user symbol, and the step of generating said data symbols in a sector-wise fashion includes organizing said sectors in two planes, in which a first plane of a sector receives the more significant user symbols of the sector and the second plane of said sector receives the less significant user symbols of said sector, and in which said third Reed-Solomon encoder is operative separately in each of said two planes with respect to the other plane.

3. A method according to claim 2, further comprising organizing said third series into a first plurality of mutually exclusive first subseries and a second plurality of mutually exclusive second subseries; adding each first subseries (P) to an exclusive first part of the user symbols of a respective sector relative to all other first subseries; and adding each second subseries (Q) to an exclusive second part of the user symbols of the respective sector and associated first subseries of parity symbols relative to all other second subseries, wherein all symbols of said first part are contained in mutually unique second parts, and all symbols of said second part are contained in mutually unique first parts.

4. A method according to claim 3, in which each subseries is formed of two parity symbols.

5. A method according to claim 4, further comprising including an additional multiple-symbol error detection quantity within a sector of data symbols.

6. A method according to claim 5, in which said error detection quantity is formed as a CRC check quantity.

7. A method according to claim 1, further comprising decoding said encoded user words by the steps of:

receiving from a record medium on which said user words have been recorded a sequence of channel symbols for demodulation to form a sequence of third numbers of code symbols;

decoding and correcting a third number of code symbols into the associated smaller second number of symbols in a first Reed-Solomon decoder corresponding to said second Reed-Solomon encoder;

de-interleaving the output symbols of said first decoder by respective different delay times over as many symbols as there are symbols in said second number;

decoding and correcting a fourth number of symbols of the associated smaller first number of symbols in a second Reed-Solomon decoder corresponding to said first Reed-Solomon encoder;

wherein said plurality of said first numbers of symbols are combined into a sector for decoding and for correcting said plurality in a third Reed-Solomon decoder corresponding to said third Reed-Solomon encoder to produce an output of user symbols that is smaller in number than the number of symbols in a sector by at least the number of said third series of parity symbols.

8. A method according to claim 7, in which an additional multiple-symbol error detector quantity is included within a sector of data symbols, and upon decoding, an insufficient error protection detectable by said error detection quantity is signalled.

9. A method according to claim 7, in which said user symbols are combined in pairs into user words; each user word consists of a more significant user symbol and a less significant user symbol; said sectors are organized in two planes in which a first plane of a sector comprises the more significant user symbols of the sector, and the second plane comprises the less significant user symbols of the sector; and said third Reed-Solomon decoder is separately operative in each of said planes from the respective other plane.

10. A method according to claim 9, in which said third series of parity symbols is organized into a first plurality of mutually exclusive first subseries and a second plurality of mutually exclusive second subseries; each first subseries is added to an exclusive first part of the user symbols of the respective sector relative to all other first subseries, and each second subseries is added to an exclusive second part of the user symbols of the sector with an associated first subseries of parity symbols relative to all other subseries; all symbols of aid first part are contained in mutually unique second parts, and all symbols of said second part are contained in mutually unique first parts; and the third Reed-Solomon decoder is separately operative for each of said first and second parts from any respective other first and second part.

11. A method according to claim 10, in which said first and second subseries each consists of two symbols and, relative to at least one first or second part, at least one symbol is rendered correctable by the associated subseries.

12. Apparatus for information transmission with error correction of a digital data information signal formed having user words, said apparatus comprising:

a first Reed-Solomon encoder receiving said user words and including first matrix multiplication means for producing a first series of parity symbols;

distributing means receiving said user words and said first series of parity symbols from said first Reed-Solomon encoder for distributing each received user word and parity symbol into a first number of two multiple-bit user symbols of equal length;

a second Reed-Solomon encoder connected to said distributing means and receiving successive first numbers of data symbols generated from said user symbols and including second matrix multiplication means for adding to each first number an associated second series of parity symbols;

interleaving means fed by said second Reed-Solomon encoder and said user symbols from said distributing means for imparting respective different delay times to interleave said first number and associated second series over as many second numbers of symbols as there are symbols in said first nunber plus associated second series;

a third Reed-Solomon encoder fed by said interleaving means for receiving successive third numbers of symbols and having third matrix multiplication means for adding to each third number an associated third series of parity symbols to produce a fourth number of code symbols; and modulating means fed by said second Reed-Solomon encoder for modulating said code symbols into channel symbols for introduction into a record medium to be later decoded.

13. Apparatus according to claim 12 further comprising a decoder including:

input means for receiving from a medium a sequence of channel symbols;

demodulating means for demodulating each channel symbol into a code symbol to constitute a sequence of third numbers of code symbols;

first decoding means connected to said demodulating means for receiving a third number of code symbols and having fourth matrix multiplication means for generating to each third number an associated first error syndrome symbol group for decoding and correcting the associated third number to output a second number of symbols smaller than said third number;

de-interleaving means connected to said first decoding means for imparting respective different delay time to de-interleave the second number of symbols received and distribute them over as many fourth numbers of symbols as there are symbols in said second number, said second and fourth numbers having the same value;

second decoding means fed by said de-interleaving means for receiving a fourth number of symbols and having fifth matrix multiplication means for generating to each fourth number an associated second error syndrome symbol group for decoding and correcting the associated fourth number to output the associated first number of symbols smaller than said fourth number; and third decoding means connected to said second decoding means and comprising a third Reed-Solomon decoder having sixth matrix multiplication means for generating further error syndrome symbols for decoding and correcting a sector of data words consisting of a plurality of first numbers of data symbols to output user symbols on an output means of said third decoding means.

14. Apparatus according to claim 13, in which said output means comprise unifying means for reconstituting a user word from a more significant user symbol and less significant user symbol, and in that said sectors are organized into two planes, a first plane of a sector being decoded exclusively to more significant user symbols, and the second plane of a sector being decoded exclusively to less significant user symbols, and in that said third Reed-Solomon decoder is separately operative in each of said two planes from the the respective other plane.

15. Apparatus according to claim [18] *13*, in which said third Reed-Solomon decoder is provided with second sequencing means for sequentially presenting within a sector mutually exclusive first parts of the user symbols of a sector with an associated first subseries of parity symbols to said third Reed-Solomon decoder, and presenting mutually exclusive second parts of the user symbols and first subseries of a sector with an associated second subseries of parity symbols to said third Reed-Solomon decoder; whereby said third Reed-Solomon decoder is separately operative for each of said first and second parts from any respective other first or second part.

16. Apparatus according to claim 13, in which an additional checker is connected to said second and third decoder means for checking a multiple-symbol error detector quantity within a sector, an output of said checker being connected to a user device output for communicating an insufficient correction signalization.

*17. A method of decoding information encoded with error correction for user words formed in the information and modulated and recorded on a record medium, comprising the steps of:*

*receiving from a record medium on which said user words have been recorded a sequence of channel symbols for demodulation to form a sequence of first numbers of code symbols;*

*decoding and correcting a first number of code symbols into an associated smaller second number of symbols in a first Reed-Solomon decoder using an encoded first series of parity symbols;*

*de-interleaving the output symbols of said first decoder by respective different delay times over as many symbols as there are symbols in said second number;*

*decoding and correcting a third number of symbols of the associated smaller first number of symbols in a second Reed-Solomon decoder using an encoded second series of parity symbols;*

*wherein a plurality of said first numbers of symbols are combined into a sector for decoding and for correcting said plurality in a third Reed-Solomon decoder using an encoded third series of parity symbols to produce an output of user symbols that is smaller in number than the number of symbols in a sector by at least the number of said third series of parity symbols.*

*18. A method according to claim 17, in which an additional multiple-symbol error detector quantity is included within a sector of data symbols and, upon decoding, an insufficient error protection detectable by said error detecting quantity is signalled.*

*19. A method according to claim 17, in which said user symbols are combined in pairs into user words; each user word consists of a more significant user symbol and a less significant user symbol; said sectors are organized in two planes in which a first plane of a sector comprises the more significant user symbols of the sector, and the second plane comprises the less significant user symbols of the sector; and said third Reed-Solomon decoder is separately operative in each of said planes from the respective other plane.*

*20. A method according to claim 19, in which said third series of parity symbols is organized into a first plurality of mutually exclusive first subseries and a second plurality of mutually exclusive second subseries; each first subseries is added to an exclusive first part of the user symbols of the respective sector relative to all other first subseries, and each second subseries is added to an exclusive second part of the user symbols of the sector with an associated first subseries of parity symbols relative to all other subseries; all symbols of said first part are contained in mutually unique second parts and all symbols of said second part are contained in mutually unique first parts; and the third Reed-Solomon decoder is separately operative for each of said first and second parts from any respective other first and second part.*

*21. Apparatus for decoding information encoded with error correction for user words formed in the information and modulated and recorded on a record medium, comprising:*

*input means for receiving from a record medium a sequence of channel symbols;*

*demodulating means for demodulating each channel symbol into a code symbol to constitute a sequence of first numbers of code symbols;*

*first decoding means connected to said demodulating means for receiving a first number of code symbols and having first matrix multiplication means for generating to each first number an associated first error syndrome symbol group for decoding and correcting the associated first number to output a second number of symbols smaller than said first number;*

*de-interleaving means connected to said first decoding means for imparting respective different delay times to de-interleave the second number of symbols received and distribute them over as many third numbers of symbols as there are symbols in said second number, said second and third numbers having the same value;*

*second decoding means fed by said de-interleaving means for receiving a third number of symbols and having second matrix multiplication means for generating to each third number an associated second error syndrome symbol group for decoding and correcting the associated third number to output the associated first number of symbols smaller than said third number; and*

*third decoding means connected to said second decoding means and comprising a Reed-Solomon decoder having third matrix multiplication means for generating further error syndrome symbols for decoding and correcting a sector of data words consisting of a plurality of first numbers of data symbols to output user symbols on an output means of said third decoding means.*

*22. Apparatus according to claim 21, in which said output means comprise unifying means for reconstituting a user word from a more significant user symbol and less significant user symbol, and in that said sectors are organized into two planes, a first plane of a sector being decoded exclusively to more significant user symbols, and the second plane of a sector being decoded exclusively to less significant user symbols, and in that said third Reed-Solomon decoder is separately operative in each of said two planes from the respective other plane.*

*23. Apparatus according to claim 21 in which said third Reed-Solomon decoder is provided with second sequencing means for sequentially representing within a sector mutually exclusive first parts of the user symbols of a sector with an associated first subseries of parity symbols to said third Reed-Solomon decoder, and presenting mutually exclusive second parts of the user symbols and first subseries of a sector with an associated second subseries of parity symbols to said third Reed-Solomon decoder; whereby said third Reed-Solomon decoder is separately operative for each of said first and second parts from any respective other first or second part.*

* * * * *